US 7,880,465 B2

(12) United States Patent  
Fung et al.

(10) Patent No.: US 7,880,465 B2
(45) Date of Patent: Feb. 1, 2011

(54) METHOD AND APPARATUS FOR CONTRAST INFLOW DYNAMIC MR ANGIOGRAPHY

(75) Inventors: Maggie M. Fung, Rockville, MD (US); Ehud J. Schmidt, Newton, MA (US); Godtfred Holmvang, Boston, MA (US); Vincent B. Ho, N. Bethesda, MD (US)

(73) Assignees: General Electric Company, Schenectady, NY (US); The Henry M. Jackson Foundation for the Advancement of Military Medicine, Inc., Rockville, MD (US); Massachusetts General Hospital, Boston, MA (US)

( * ) Notice: Subject to any disclaimer, the term of this patent is extended or adjusted under 35 U.S.C. 154(b) by 296 days.

(21) Appl. No.: 12/132,706

(22) Filed: Jun. 4, 2008

(65) Prior Publication Data

US 2009/0302840 A1 Dec. 10, 2009

(51) Int. Cl.
G01V 3/00 (2006.01)
(52) U.S. Cl. ...................... 324/306; 324/309
(58) Field of Classification Search .......... 324/306, 324/309
See application file for complete search history.

(56) References Cited

U.S. PATENT DOCUMENTS

| | | | | |
|---|---|---|---|---|
| 5,251,628 A | * | 10/1993 | Foo | 600/413 |
| 5,435,303 A | * | 7/1995 | Bernstein et al. | 600/413 |
| 5,830,143 A | | 11/1998 | Mistretta et al. | |
| 5,997,883 A | * | 12/1999 | Epstein et al. | 324/306 |
| 6,198,959 B1 | * | 3/2001 | Wang | 600/413 |
| 6,201,985 B1 | * | 3/2001 | Polzin et al. | 600/411 |

OTHER PUBLICATIONS

Fung et al., "Novel Approach for ECG-Gated Dynamic Contrast Enhanced MRA", Oct. 2007.
Fung et al., "Contrast Inflow Dynamics MRA (CIDA) with Automatic Triggering: Novel Approach for ECG-Gated Dynamic Contrast Enhanced MRA" Jan. 2008.
Ohno et al., "MR Angiography with Sensitivity Encoding (SENSE) for Suspected Pulmonary Embolism: Comparison with MDCT and Ventilation—Perfusion Scintigraphy," AJR, Jul. 2004, pp. 91-98.

(Continued)

*Primary Examiner*—Louis M Arana
(74) *Attorney, Agent, or Firm*—Ziolkowski Patent Solutions Group, SC

(57) ABSTRACT

A system and method for MR imaging includes a computer programmed to determine first and second view-ordering sequences. The first and second view-ordering sequences comprise values corresponding to respective views of first and second k-space data sets, respectively, wherein the values corresponding to a central view of each the first and second k-space data sets are positioned such that acquisition of k-space data in each central view is acquired from a first and second anatomical region, respectively, as a contrast agent passes therethrough. The positions of the values corresponding to the central views of the first and second k-space data sets within the respective sequences are different. The computer is further programmed to acquire MR data according to the first and second view-ordering sequences over a series of cardiac cycles to fill data in the first and second k-space data sets, respectively.

22 Claims, 10 Drawing Sheets

OTHER PUBLICATIONS

Kluge et al., "Acute Pulmonary Embolism to the Subsegmental Level: Diagnostic Accuracy of Three MRI Techniques Compared with 16-MDCT," AJR, Jul. 2006, pp. W7-W14.

Fung et al., "Novel Approach for ECG-Gated Dynamic Contrast Enhanced MRA", Oct. 2007.

Groves et al., "ECG-gated high resolution Contrast-Enhanced MR angiography of thoracic aorta," Proc. Intl. Soc. Mag. Reson. Med., vol. 14, 2006, p. 506.

Katoh et al., "Impact of ECG-gating in contrast-enhanced MR angiography for the assessment of the left atrium and the pulmonary veins," Proc. Intl. Soc. Mag. Reson. Med., vol. 14, 2006, p. 507.

Riederer et al., "MR Fluoroscopy: Technical Feasibility," Magnetic Resonance in Medicine, vol. 8, 1988, pp. 1-15.

Korosec et al., "Time-Resolved Contrast-Enhanced 3D MR Angiography," MRM, vol. 36, 1996, pp. 345-351.

Fung et al., "ECG-gated Contrast Enhanced Angiography with SENSE Parallelized Imaging and Partial Fourier slice-encoding for Improved Pulmonary Vein and Left Atrium Imaging" Jan. 2007.

Fung et al., "Clinical Applications of Contrast Inflow Dynamics MRA (CIDA): Novel Approach for ECG-Gated Dynamic Contrast Enhanced MRA", May 2008.

* cited by examiner

METHOD AND APPARATUS FOR CONTRAST INFLOW DYNAMIC MR ANGIOGRAPHY

BACKGROUND OF THE INVENTION

The invention relates generally to an apparatus and method of imaging one or more vasculatures using a magnetic resonance (MR) system and, more particularly, to acquiring data for more than one k-space during a cardiac cycle.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Contrast-enhanced MR angiography (CEMRA) is an MR technique used to create MR images to aid in the assessment of diseases such as aortic aneurysms, aortic dissection and pulmonary embolism. In addition, CEMRA has also been utilized for imaging the left atrium and pulmonary veins for pre-operative planning of cardiac ablation procedures. With CEMRA, k-space acquisition corresponds in time and space with the arrival of the maximum, or near maximum, concentration of a contrast agent. As a result, veins and/or arteries appear with greater contrast in resulting images. Unfortunately, CEMRA techniques may suffer from motion artifacts, many of which cause blurring. For example, CEMRA images of cardiac and thoracic vasculatures may suffer from blurring and pulsatility artifacts due to cardiac motion.

To reduce such artifacts, electrocardiogram (ECG) gated acquisition is commonly used in conjunction with CEMRA. Often, however, ECG gated acquisition results in an elongation of scan time in order to obtain desired image spatial resolution. As such, image spatial resolution may suffer if scan times are reduced.

With conventional CEMRA, visualizing a lone vasculature component, such as the arterial component, often requires the setting of a variety of imaging parameters. These parameters, which often require accurate settings, include the timing of the contrast-agent arrival, optimization of the imaging speed, and the determination of the imaging acquisition k-space ordering scheme. If proper resolution of individual vasculature components such as arteries and veins is required, all of the above-mentioned parameters need to be optimized and set correctly in order to minimize the presence of undesired vasculature components in the resulting image. If such imaging parameters are not optimized, there may be an overlap of vasculature components, which may lead to an erroneous image interpretation.

Further, if examination of several vasculature components is desired, a scan must be repeated multiple times, and the imaging parameters of each component must be optimized for each scan. For example, separate scans, each with optimized parameters, would need to be performed for each of the arterial components and the venous components. Due to this need to optimize such parameters, multiple-vasculature-component protocols frequently lead to severe compromises. One compromise may include a reduction in the spatial resolution to shorten scan time of the vascular component and allow sufficient temporal speed for proper segmentation of vascular transit. Another compromise may include an extreme extension of the acquisition length due to the need for serial scans.

Scan times may also have imposed constraints. In many cases, the total scan time available is limited due to patient limitations such as breath-hold capacity or to the inherent rapid speed of contrast bolus passage through the vasculature. Due to a limited scan time, a conventional CEMRA acquisition of multiple vasculature components may not be possible with a single bolus acquisition. In these cases, separate contrast injections may be required to image each vascular bed. For example, to image the arteries and veins associated with the cardiac vasculature with high spatial resolution and appropriate contrast, conventional CEMRA acquisition often requires separate injections for each venous and arterial region.

Another possible approach for multiple vasculature acquisition is a time-resolved CEMRA technique that uses an alternated k-space scheme, such as TRICKS or TWIST techniques. With such a time-resolved CEMRA technique, the central and peripheral k-space views are sampled in an interleaved manner with over-sampling of the central k-space data. The temporal dynamic images are later reconstructed using subsets of the central and peripheral k-space data. However, the spatial resolution and temporal resolution of these scans are limited by the breath-hold time. Further, when ECG gating is required, whereby the data is only acquired in a specific temporal window within the cardiac cycle, the achievable spatial resolution is even further limited.

It would therefore be desirable to design a system and method capable of imaging one or more vasculature components while achieving a robust image contrast of the vasculature components.

BRIEF DESCRIPTION OF THE INVENTION

In accordance with one aspect of the invention, an MR imaging apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images and a computer. The computer is programmed to determine a first and second view-ordering sequence. The first view-ordering sequence comprises values corresponding to respective views of a first k-space data set, wherein the value corresponding to a central view of the first k-space data set is positioned such that acquisition of k-space data in the central view is acquired from a first anatomical region as a contrast agent passes therethrough. The second view-ordering sequence comprises values corresponding to respective views of a second k-space data set, wherein the value corresponding to a central view of the second k-space data set is positioned such that acquisition of k-space data in the central view is acquired from a second anatomical region as a contrast agent passes therethrough, and wherein the position of the value corresponding to the central view of the first k-space data set within the first view-ordering sequence is different than the position of the value corresponding to the central view of the second k-space data set within the second view-ordering sequence. The computer is further programmed to acquire MR data according to the first and second view-ordering sequences over a series of cardiac cycles to fill data in the first and second k-space data sets, respectively.

In accordance with another aspect of the invention, a computer readable storage medium having stored thereon a computer program comprising instructions, which when executed by a computer, cause the computer to determine a first and second acquisition scheme for acquiring MR data over a series of consecutive cardiac cycles for first and second k-space data sets, respectively. The first acquisition scheme is configured to acquire MR data for a central portion of the first k-space data set from a first vasculature of the subject as a contrast agent passes through the first vasculature. The second acquisition scheme is configured to acquire MR data for a central portion of the second k-space data set from a second vasculature of the subject as the contrast agent passes through the second vasculature. The second acquisition scheme is different than the first acquisition scheme. The instructions further cause the computer to populate the first and second k-space data sets via application of the first and second acquisition schemes, respectively, and reconstruct an image from at least one of the first and second k-space data sets.

In accordance with another aspect of the invention, a method of MR imaging comprises determining a first view-encode ordering scheme for filling a first k-space data set over multiple sequential cardiac cycles such that a maximum concentration of a contrast agent in a first anatomical region of a subject passes through the first anatomical region during acquisition of a central portion of the first k-space data set, and determining a second view-encode ordering scheme for filling a second k-space data set over the multiple sequential cardiac cycles such that a maximum concentration of a contrast agent in a second anatomical region of a subject passes through the second anatomical region during acquisition of a central portion of the second k-space data set. The first anatomical region is different than the second anatomical region and the first view-ordering scheme is different than the second view-ordering scheme. The method of MR imaging further comprises storing the first and second view-encode ordering schemes in computer memory.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figure 1:
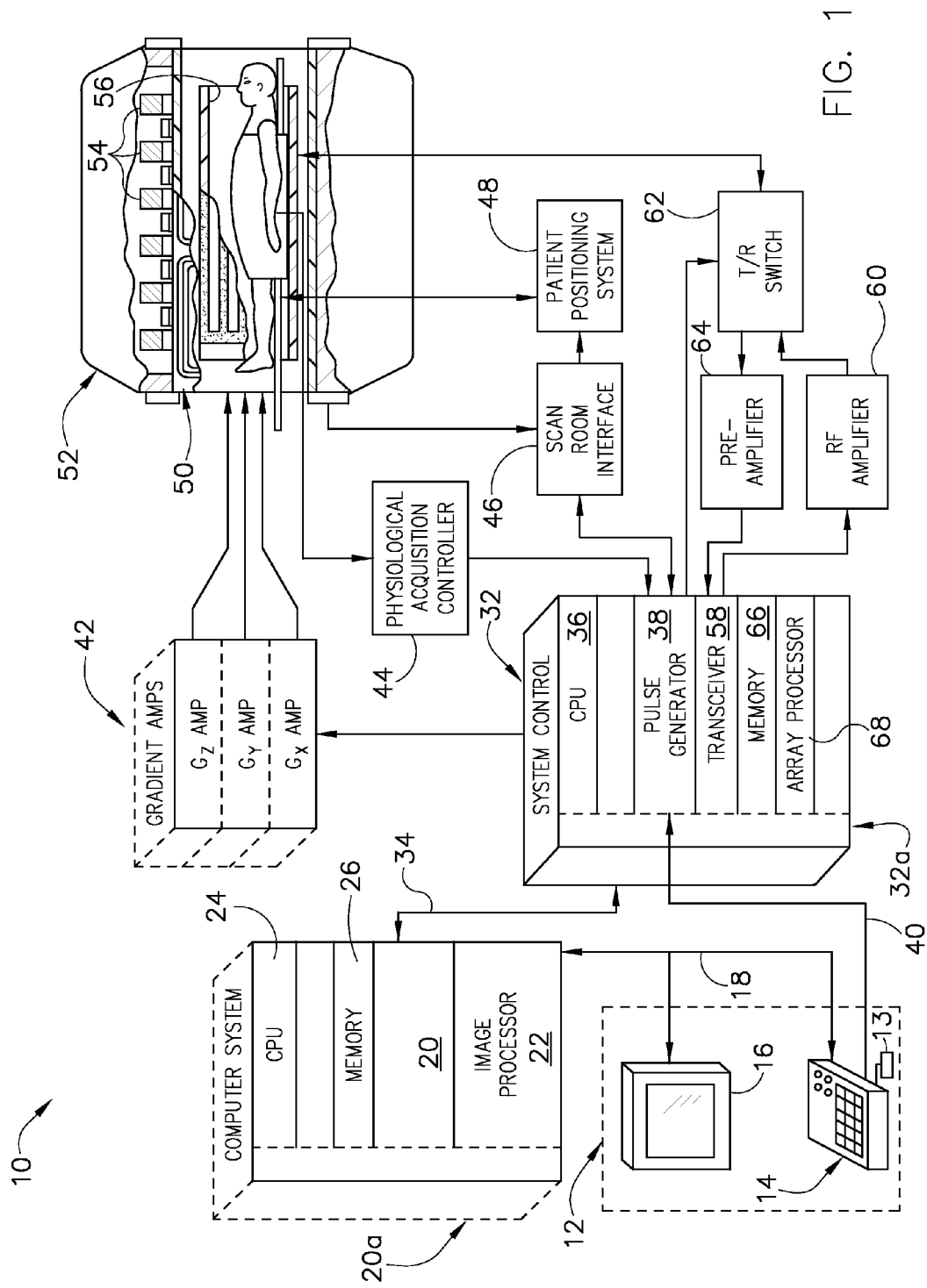
FIG. 1 is a schematic diagram of an exemplary MR imaging system for use with embodiments of the present invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
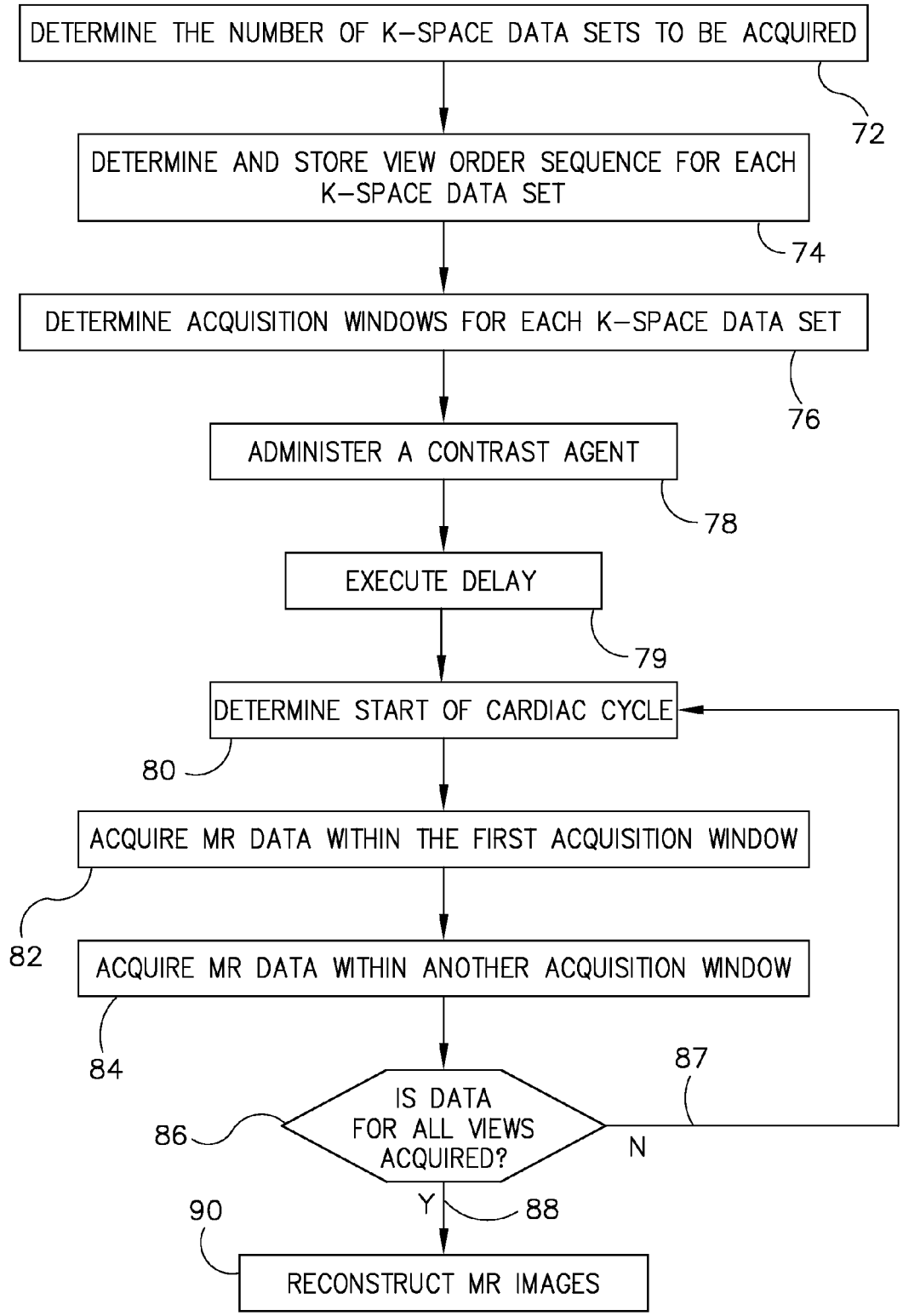
FIG. 2 is a flowchart depicting a variable-center k-space multi-acquisition technique according to an embodiment of the invention.

Referring to FIG. 2, a flowchart depicts a variable-center k-space multi-acquisition technique according to an embodiment of the invention. Technique 70 provides for acquisition of multiple k-space data sets that are acquired during a series of cardiac cycles, with a portion of each k-space data set being acquired during every cardiac cycle. In an embodiment of the invention, the multiple k-space data sets are three-dimensional (3D) k-space data sets used in MR volume imaging where each k-space data set includes a plurality of views (e.g., slice, frequency, or phase). However, it is also contemplated that embodiments of the invention may also be applicable to two-dimensional (2D) imaging where a complete k-space data set may be a single slice of data. The view-encoding schemes for each 3D k-space acquisition are preferably determined in a manner such that a central portion of a particular k-space acquisition is acquired from a particular vasculature or anatomical region-of-interest as a contrast agent passes therethrough. That is, the view-encoding schemes are preferably determined according to a variable center k-space acquisition approach. Further, it is contemplated that the view-ordering schemes could include one or more of slice-encode, frequency, and/or phase ordering schemes.

Technique 70 begins with a determination of the number of data sets that will be acquired at STEP 72. The number of data sets to be acquired influences the data that will be acquired in each cardiac cycle. For example, an embodiment shown in FIG. 3 graphically depicts the acquisition of two data sets 94, 96 according to two slice encoding sequences 98, 100. That is, a first data set 94 is populated 102-140 according to a phase I slice-encoding sequence 98, and a second data set 96 is populated 142-180 according to a phase II slice-encoding sequence 100. The data sets 94, 96 are preferably acquired over a same series of cardiac cycles 182. The number of data sets 94, 96 may be chosen either by an operator or a computer.

Referring back to FIG. 2, slice-encode order sequences (i.e., view order sequences) for each data set are determined and stored at STEP 74. When used with contrast-enhanced imaging, technique 70 allows for independently optimizing acquisition of the central regions of each k-space data set such that a central portion or region may be acquired when a high concentration of a contrast agent is passing through a vasculature of interest. For example, if the k-space data sets correspond to a respective vasculature of an imaging patient, a central portion of the k-space data set corresponding to the upstream vasculature may be acquired prior to acquisition of a central portion of the k-space data set corresponding to the downstream vasculature as the contrast agent passes from one vasculature to the other. On the other hand, it is contemplated that the anatomical or vasculature regions may overlap. That is, two or more k-space data sets, with at least two of the data sets employing different view ordering schemes, may be acquired from the same vasculature or anatomical region as a contrast agent passes therethrough. As such, a dynamic representation of a vasculature or anatomical region as it changes over a period of time can be determined therefrom.

Figure 3:
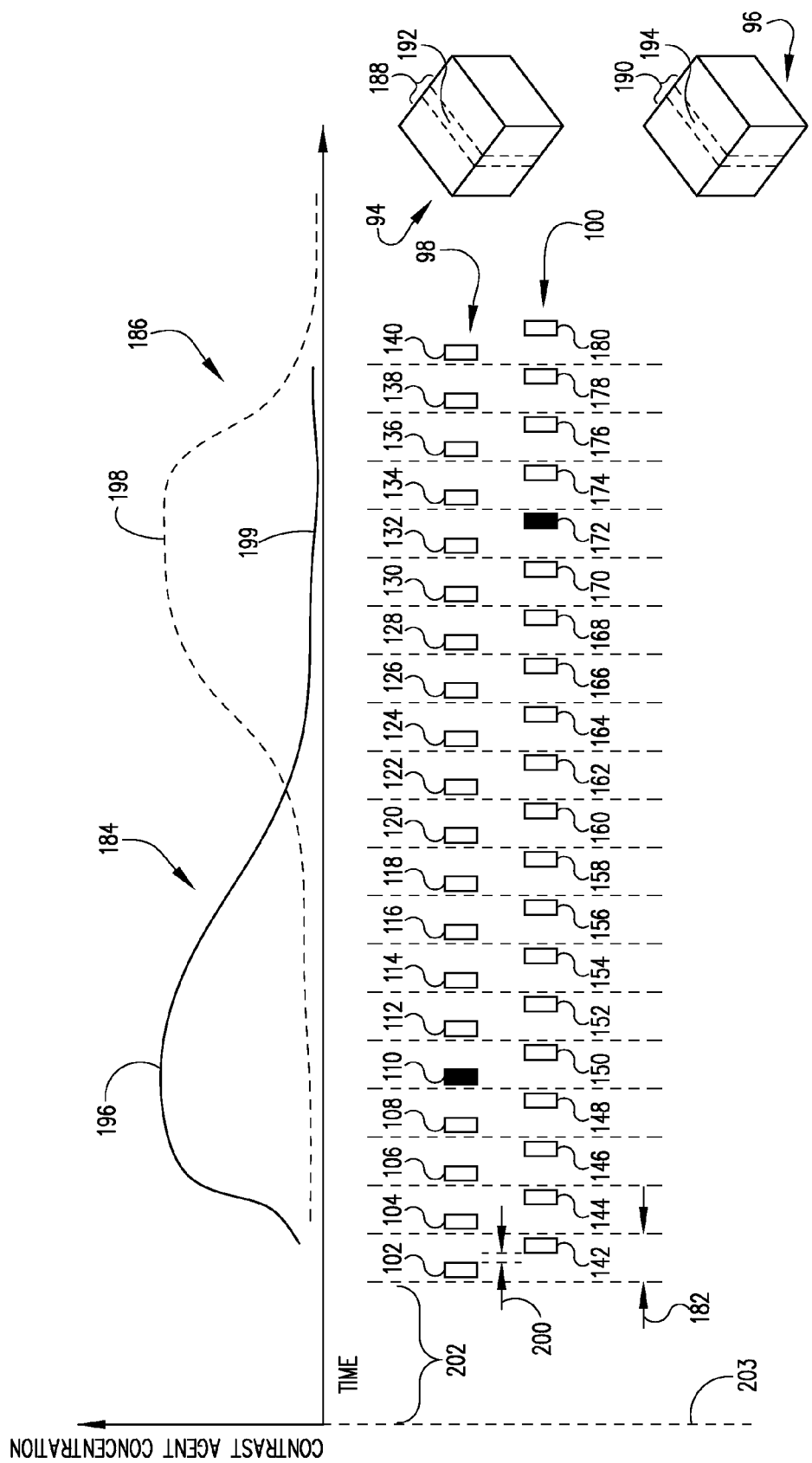
FIG. 3 is a graphical representation of an embodiment illustrating the acquisition of two data sets according to two view encoding sequences.

To illustrate, FIG. 3 shows a curve 184 representing the concentration of a contrast agent as it passes through a first, upstream vasculature and a curve 186 representing the concentration of the contrast agent as it passes through a second, downstream vasculature. The two vasculatures or anatomical regions may be in the same field of view (FOV). It is desired that the central portion 188 of a k-space data set 94 be acquired as a high concentration of contrast agent moves through the first vasculature and that the central portion 190 of another k-space data set 96 be acquired as a high concentration of contrast agent moves through the second vasculature. As described above, data sets 94, 96 are preferably acquired over a same series of cardiac cycles 182. Accordingly, the view order sequences (e.g., slice-encode order sequences 98, 100) are determined in an embodiment of the invention, such that a central slice-encode 192 of the first data set 94 and a central slice-encode 194 of the second data set 96 are acquired during phase acquisitions 110, 172, respectively, as the contrast agent concentration 184, 186 is at a maximum or near maximum concentration 196, 198 in the respective anatomical regions-of-interest.

In an alternative, it is contemplated that the variable-center acquisition scheme could be employed such that two or more k-space data sets are acquired from the same vasculature or region. As such, it is contemplated that the a central slice-encode 192 of the first data set 94 and a central slice-encode 194 of the second data set 96 may be acquired during phase acquisitions 110, 172, respectively, as the contrast agent concentration varies 196, 199.

Determining respective slice-encoding order sequences for data sets 94, 96 includes determining an acquisition order for all slice-encode acquisitions of data sets 94, 96. Once a desired position of the central slice-encode acquisitions 110, 172 in slice encoding order sequences 98, 100 is known, the positions of the remaining slice-encode acquisitions relate to the desired slice-encoding order scheme as discussed below with respect to FIGS. 4 and 5.

Referring again to FIG. 2, after determining the slice-encode order sequences for each data set at STEP 74, the acquisition windows for each data set are then determined at STEP 76. The acquisition windows correspond to the portions of the cardiac cycle in which each data set is partially acquired. For example, where two data sets are to be acquired, the acquisition windows may be designed such that acquisition of a first data set occurs in a systolic phase of the cardiac cycle and that the acquisition of a second data set occurs in a diastolic phase of the cardiac cycle. The size or length of the determined acquisition windows may depend on the number of k-space lines acquired for each data set. For example, the number of k-space lines collected for a first data set may be different than the number of k-space lines collected for a second data set. As such, an image reconstructed from the first data set would have a different spatial resolution than an image reconstructed from the second data set. Accordingly, the length or size of the acquisition windows may be increased to allow for the acquisition of more k-space lines. Likewise, the length or size of the acquisition windows may be decreased if less k-space lines are to be acquired.

By manipulating the number of k-space lines to be acquired for each data set, and thus manipulating the corresponding acquisition window temporal length, effects of cardiac motion may also be minimized. For example, often the systolic quiet period is shorter than the diastolic quiet period. As such, the number of lines acquired during the systolic quiet period may be chosen to be less than the number of k-space lines acquired during the diastolic period in order to reduce the acquisition of k-space data during periods of greater heart displacement. Accordingly, motion effects may be less evident in images reconstructed from corresponding data sets.

The acquisition windows may further be designed in such a manner as to prevent any acquisition window overlap. For example, acquisitions 102-140 of FIG. 3 occur during acquisition windows that correspond with a first phase of cardiac cycles 182, and acquisitions 142-180 occur during acquisition windows that correspond with a second phase of cardiac cycles 182. The first and second phases of cardiac cycles 182 are determined such that there is no overlap there between, as evidenced by the interval 200 between the two acquisitions 102, 142. It is contemplated, however, that the acquisition windows corresponding to the acquisitions for two or more data sets could overlap. Such overlapping acquisition windows will be further described with respect to FIG. 6.

Referring back to FIG. 2, after the acquisition windows are determined at STEP 76, a contrast agent is administered to a subject at STEP 78. After the contrast agent is administered, execution of a delay at STEP 79 allows for the contrast agent to travel to the particular anatomical regions-of-interest. It is contemplated that the delay (shown as delay 202 of FIG. 3) may be calculated from the time of injection or from the time in which the contrast agent concentration is monitored at a reference anatomical region 203 during a live scan.

Following the delay, imaging is begun with the detection or determination of the start of a cardiac cycle at STEP 80. In an embodiment of the invention, the cardiac cycle may be measured between like points of adjacent QRS complexes. As is known by those skilled in the art, a QRS complex is a waveform that represents the electrical activation of the ventricles. The cardiac cycle, for example, may be an RR cycle. That is, the cardiac cycle may start at an R peak of one QRS complex and end at an R peak of the next QRS complex. Though an ECG monitoring system if often used to detect QRS complexes of a cardiac cycle, alternate embodiments for detecting or determining the start of a cardiac cycle are contemplated. For example, other cardiac synchronization devices such as blood oxygenation gating and/or blood pressure gating may be used to detect or determine a cardiac cycle. After the detection of the start of a cardiac cycle at STEP 80, MR data is acquired within the first acquisition window of the detected cardiac cycle when at STEP 82. Following the acquisition of MR data within the first acquisition window at STEP 82, MR data is acquired within another acquisition window of the detected cardiac cycle at STEP 84. Partial Fourier Transform and parallel imaging techniques may be employed to shorten breath-hold and/or acquisition times during STEPs 80 and 82. Process control proceeds to decision STEP 86 and determines if data for all views (i.e., slice-encodes in the present embodiment) have been acquired. If data for all slice-encodes has not been acquired 87, process control proceeds to STEP 80 to determine the start of a succeeding cardiac cycle and proceed through STEPs 82 and 84 to acquire MR data for additional slice-encodes. When data for all slice-encodes are acquired 88, process control proceeds to STEP 90 for image reconstruction. It is preferable that the determined data sets be acquired or populated during a single breath-hold.

Figure 4:
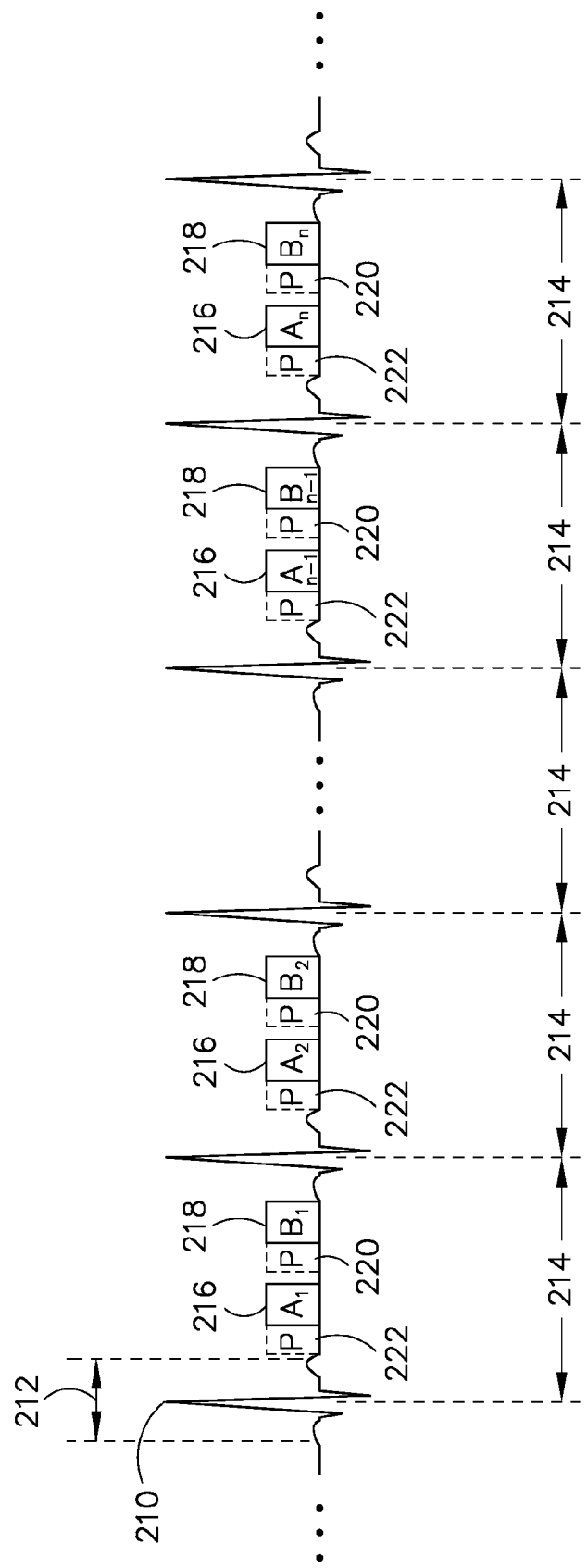
FIG. 4 is a graphical representation of the acquisition of k-space data in multiple phases of the cardiac cycle according to an embodiment of the present invention.

FIG. 4 shows a graphical representation of the acquisition of k-space data in multiple phases of the cardiac cycle according to an embodiment of the present invention. Phase I slice-encode acquisitions 216 and phase II slice-encode acquisitions 218 during a series of cardiac cycles 214 are shown. In one embodiment, phase I slice-encode acquisitions 216 correspond to acquisitions during a systolic phase of the cardiac cycle 214, and phase II slice-encode acquisitions 218 correspond to acquisitions during a diastolic phase of the cardiac cycle 214. It is contemplated, however, that slice-encode acquisitions 216, 218 may correspond to different or other phases of the cardiac cycle 214. Such acquisitions 216, 218 may be acquired using an in-plane, phase-encoding loop along with a slice-encoding loop, the in-plane phase-encoding loop being enclosed within the slice-encoding loop.

Though the cardiac cycle 214 shown in FIG. 4 is defined by the repeating "R" portion 210 of a QRS 212 complex, it is contemplated that any repeating portion of a cardiac cycle 212 could be used to define the cardiac cycle 214. Phase I acquisitions 216 each acquire a respective slice-encode of MR data of a first 3D k-space data set. In one embodiment of the invention, a slice-encode ordering sequence for the first 3D k-space data set is:

A=[6, 7, 8, 9, 10, 11, 12, 13, 14, 15, 5, 16, 4, 17, 3, 18, 2, 19, 1, 20], where each value corresponds to a slice-encode of the first 3D k-space data set. For example, $A_1$, which corresponds to the first value in the sequence, represents the sixth slice-encode of the first 3D k-space data set, and the last acquisition, $A_{20}$, which corresponds to the twentieth value in the sequence, represents the twentieth slice-encode of the first 3D k-space data set.

Phase II acquisitions 218 each acquire a respective slice of MR data of a second 3D k-space data set. In one embodiment of the invention, a slice-encode ordering sequence for the second 3D k-space data set is:

B=[20, 1, 19, 2, 18, 3, 17, 4, 16, 5, 15, 14, 13, 12, 11, 10, 9, 8, 7, 6], where $B_1$, the first position of the second 3D k-space data set, represents the acquisition of the twentieth slice encode of the second 3D k-space data set, and $B_{20}$, the twentieth position of the second 3D k-space data set, represents the sixth slice-encode acquisition of the second 3D k-space data set.

As shown by the two sequences A and B above, each 3D k-space data set has twenty slice encodes according to one embodiment. Accordingly, a central portion of each 3D k-space data set is the tenth slice-encode. As such, according to the sequences A and B described above, a central portion of the first 3D k-space data set is acquired at $A_5$ and a central portion of the second 3D k-space data set is acquired at $B_{16}$. That is, $A_5$ represents the fifth acquisition of the phase I acquisitions 216, when the tenth slice-encode of the first 3D k-space data set is acquired. Likewise, $B_{16}$ represents the sixteenth acquisition of the phase II acquisitions 218, when the tenth slice-encode of the second 3D k-space data set is acquired. Each of the central portion acquisitions, $A_5$ and $B_{16}$, preferably occurs as the contrast agent is at or near a maximum concentration in the particular vasculature. For example, acquisition $A_5$ may correspond to the fifth acquisition 110 shown in FIG. 3, as the contrast agent is at or near a maximum concentration 196 in the particular vasculature. In a similar manner, acquisition $B_{16}$ may correspond to the sixteenth acquisition 172 shown in FIG. 3, as the contrast agent is at or near a maximum concentration 198 in that particular vasculature.

As listed above, the slice-encode acquisition order A for the phase I acquisitions 216 is a mirror image of the second slice-encode acquisition order B for the phase II acquisitions 218. In other words, the first sequence of slice-encodes, [6, 7, 8, 9, 10, 11, 12, 13, 14, 15, 5, 16, 4, 17, 3, 18, 2, 19, 1, 20], is the mirror of the second sequence of slice-encodes, [20, 1, 19, 2, 18, 3, 17, 4, 16, 5, 15, 14, 13, 12, 11, 10, 9, 8, 7, 6]. However, it is contemplated that the second acquisition scheme or slice-encode order B for phase II acquisitions 218 need not be a mirror image of the first acquisition scheme or slice-encode acquisition order A. That is, slice-encode acquisition orders A and B may be independently determined to correspond with the behavior of the contrast agent as it moves through the respective vasculature regions-of-interest. Such movement in one vasculature region-of-interest may not be a mirror of the movement of the contrast agent and the other vasculature region-of-interest. As such, a variety of acquisitions schemes can be determined and stored on computer memory.

Still referring to FIG. 4, it is contemplated that a preparation pulse "P" 220, shown in phantom, could be transmitted before each of the phase II acquisitions 218. Preparation pulses 220 allow manipulation of contrast in one or more images reconstructed from the phase II acquisitions 218. It is also contemplated that a preparation pulse 222, also shown in phantom, could be transmitted before the phase I acquisitions 216 in addition to, or instead of, transmitting the preparation pulse 220 before each of the phase II acquisitions 218. These preparation pulses, as known by those skilled in the art, may include a sequence of single or multiple RF pulses, variable inter-pulse time delays, and gradient waveforms.

Figure 5:
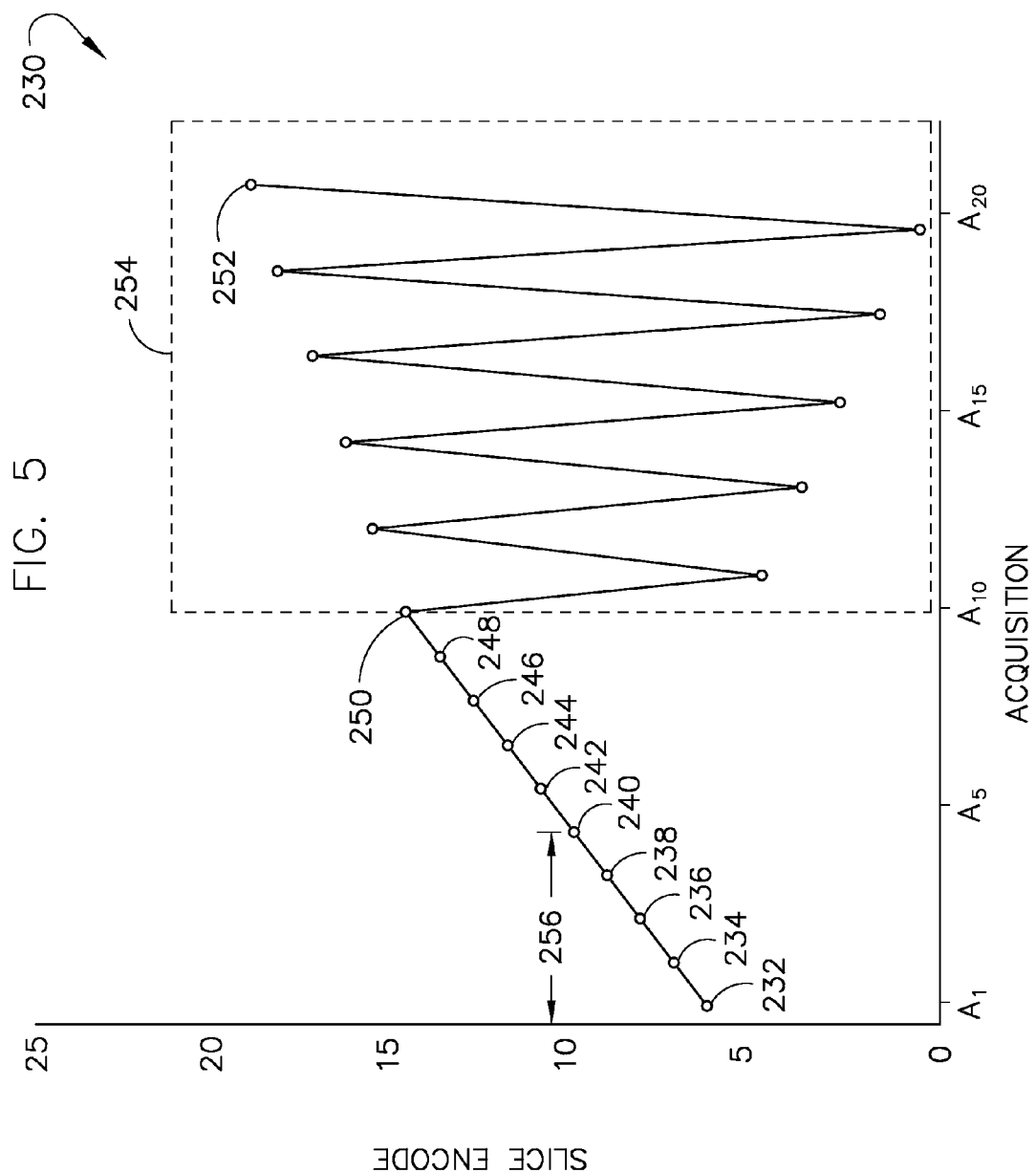
FIG. 5 is a graphical depiction of a sequence of slice-encodings according to an embodiment of the invention.

Referring now to FIG. 5, a graphical depiction of the first sequence of slice acquisitions A, discussed above, for the phase I acquisitions 216 of FIG. 4 is shown. As shown, the k-space acquisition scheme 230 begins with sequential acquisitions 232-250 and ends with a set of centric acquisitions 254. In this embodiment, acquisition 240 of a central portion slice, the tenth slice-encode of the 3D k-space data set, would correspond with the arrival of a maximum or near maximum concentration of a contrast agent in a first vasculature or anatomical region. As mentioned, the sequence 230 seen in FIG. 5 is the same as that which is discussed above with respect to acquisition order A of FIG. 4. That is, like the sequence A discussed above, the order of slice-encode acquisition is as follows: [6, 7, 8, 9, 10, 11, 12, 13, 14, 15, 5, 16, 4, 17, 3, 18, 2, 19, 1, 20]. Accordingly, the first acquisition 232, $A_1$, corresponds with the acquisition of the sixth slice-encode. The fifth acquisition 240, $A_5$, corresponds with the acquisition of a central slice-encode (slice-encode ten), and the last acquisition 252 corresponds with the acquisition of the twentieth slice-encode.

The center portion 240 of this k-space data set is acquired after a specified slice-encode delay 256. In one embodiment, the slice-encode delay 256 is determined by the following interval:

$$RR\_delay = N/(\text{time per } RR)$$ (Eqn. 1), where N is the desired delay time to acquire a central slice-encode after start of the acquisitions, "time per RR" is the temporal length of the RR cycles of the subject, and RR_delay is the sequence position of the center slice-encode of the k-space space data set. For illustrative purposes, take a subject with a heart rate of sixty beats per minute. If a slice-encode is being acquired once per each RR cycle, one slice-encode would be acquired per every one second. If the desired delay time is N=5 s, then the RR_delay would be determined as follows: RR_delay=5 s/1 s, leaving RR_delay=5 or the fifth sequence position.

The acquisition scheme 230 shown in FIG. 5 is based on a sequential ordering scheme (acquisitions 232-250) followed by a centric ordering scheme (acquisitions 254). It is contemplated that other acquisition schemes could be employed. For example, where the center slice (slice number ten) is to be acquired in the fifth position, a reverse-centric ordering scheme followed by a forward-centric ordering scheme may be represented by the sequence:

C=[8, 12, 9, 11, 10, 13, 7, 14, 6, 15, 5, 16, 4, 17, 3, 18, 2, 19, 1, 20].

As another example, a sequential ordering scheme for outermost k-space with a centric ordering scheme for the rest of k-space may be represented by the sequence:

D=[1, 2, 3, 4, 10, 9, 11, 8, 12, 7, 13, 6, 14, 5, 15, 4, 16, 17, 18, 19, 20].

Application of one acquisition ordering scheme versus another acquisition ordering scheme may be evaluated based on a Fourier-transformed point-spread function in the image domain to evaluate their impact on signal intensity and sharpness of features within the images. The acquisition ordering schemes may be also selected to minimize the discontinuity in k-space.

Figure 6:
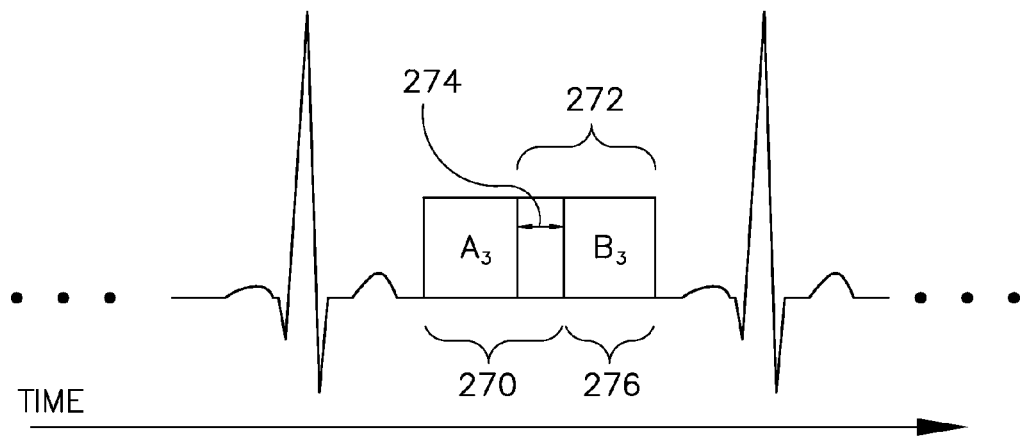
FIG. 6 is a graphical depiction of an acquisition scheme having two overlapping acquisition windows according to an embodiment of the invention.

While the acquisitions for the separate phases in the cardiac cycles described in embodiments above are described such that the acquisition windows do not overlap, two phase acquisition windows 270, 272 may include an overlapping segment 274 as shown in FIG. 6 according to another embodiment of the invention. Time constraints during the cardiac cycles may cause that the acquisition window 270 of a subset of first k-space data set, such as $A_3$, overlap 274 with the acquisition window 272 of a subset of another k-space data set, such as $B_3$. In this instance, view sharing techniques known in the art can be employed. That is, during the overlapping interval 274, acquisition occurring during the first window 270, for subset $A_3$, would continue to completion. Those acquired views would then be shared with partial subset $B_3$ acquired during the shortened window 276. For example, if the overlap 274 were equivalent to one hundred milliseconds, then one hundred milliseconds worth of views from the first k-space subset, $A_3$, would be shared with the other k-space subset, $B_3$. It is contemplated, however, that the acquisition window for subset $A_3$ could be shortened (not shown), rather than the acquisition window for $B_3$. In this instance, the views acquired in the overlapping region 274 for subset $B_3$ would be shared with subset $A_3$.

Figure 7:
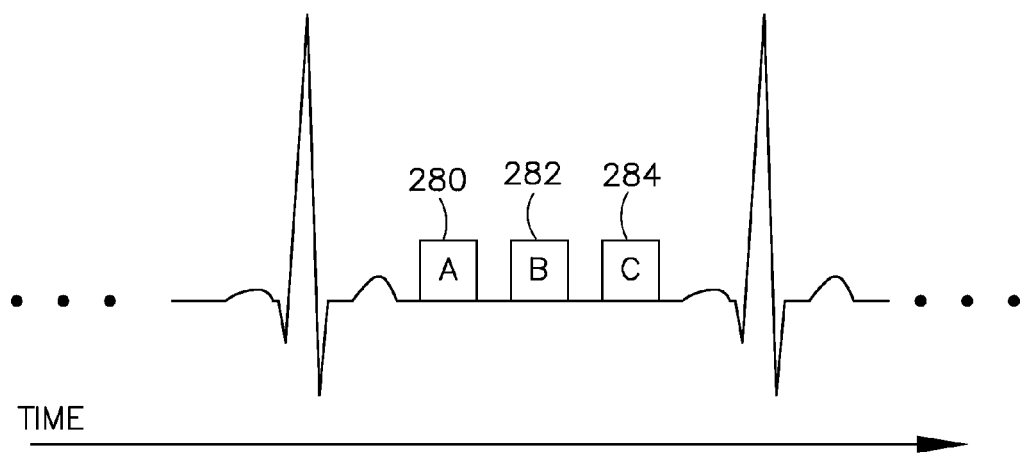
FIG. 7 is a graphical depiction of an embodiment illustrating more than two acquisitions during a cardiac cycle.

Though FIGS. 3-4 and 6 depict the acquisition of MR data during two phases of a heart cycle or interval, it is contemplated that more than two phases could be acquired. That is, there may be acquisition of data to at least partially fill additional k-space data sets during each cycle of the series of successive cardiac cycles. For example, FIG. 7 depicts an embodiment illustrating acquisitions 280-284 during three phases of a cardiac cycle. In other words, the acquisition 280-284 of subsets for three different k-space data sets, A, B, and C, is shown. It is contemplated that each k-space data set, A, B, or C, are acquired using the variable center approach set forth above. That is, the acquisition scheme for subsets of the k-space data sets A, B, and C could employ the variable-center approach to ensure that a central portion of each k-space is acquired from a respective anatomical region as a contrast agent passes therethrough. However, it is also contemplated that the acquisition schemes for subsets of the third or other additional k-space data sets need not follow the variable-center acquisition approach. That is, it is preferable that a least two data sets are acquired according to the variable center approach while any acquisition scheme could be used for additional data sets. For example, the acquisition scheme for a third k-space could mimic one of the other acquisition schemes.

Figure 8:
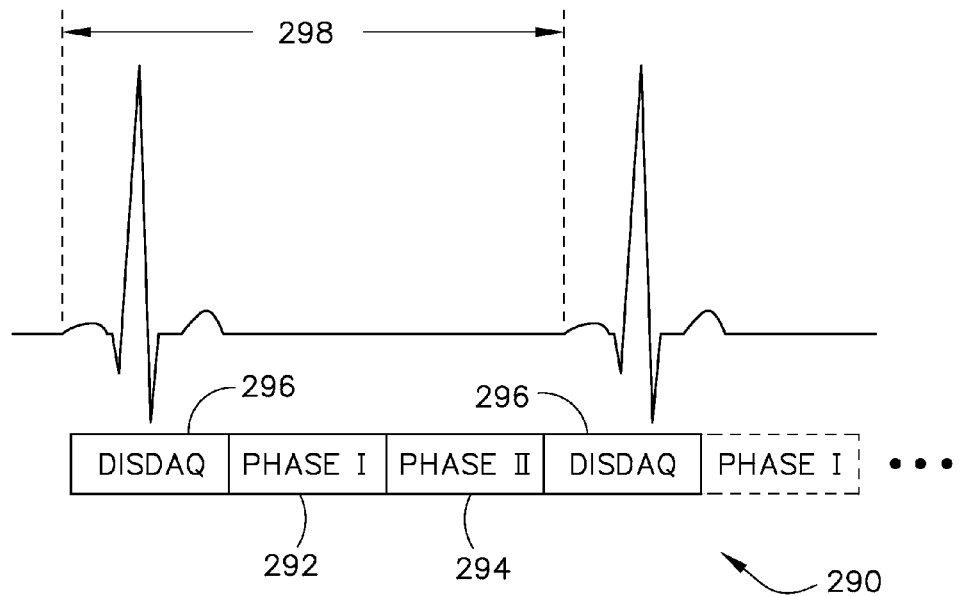
FIG. 8 is a depiction of an acquisition scheme employing disdaq pulse sequences.
Figure 9:
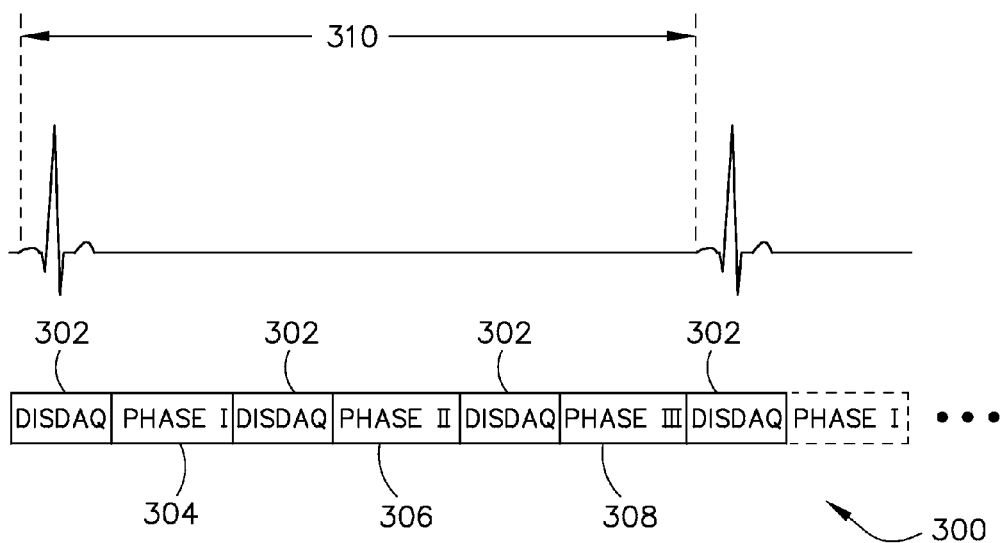
FIG. 9 is a depiction of another acquisition scheme employing disdaq pulse sequences.

Referring now to FIG. 8 and FIG. 9, two illustrations depicting two embodiments 290, 300 employing disdaq pulse sequences 296, 302 are shown. As known by those skilled in the art, disdaq pulse sequences are sequences used to bring a material in a field of view (FOV) to a steady state. In one embodiment 290 shown in FIG. 8, k-space acquisition occurs during two phases 292, 294 of a cardiac cycle 298, with a disdaq pulse sequence 296 being played out before each phase I acquisition 292. Each disdaq pulse sequence 296 helps to bring the material in the field of view (not shown) to a spin equilibrium steady-state before k-space acquisition 292, 294 begins.

FIG. 9 depicts yet another embodiment 300 where disdaq pulse sequences 302 are employed. Here, subsets of three different k-space data sets are acquired 304-308 within each cycle 310. In this embodiment 300, a disdaq pulse sequence 302 is played out before each acquisition 304-308 so that the material in the FOV may be brought to steady-state before each acquisition 304-308. As will be understood by those skilled in the art, a sequence of preparation pulses (not shown) may also be played during the disdaq periods.

Figure 10:
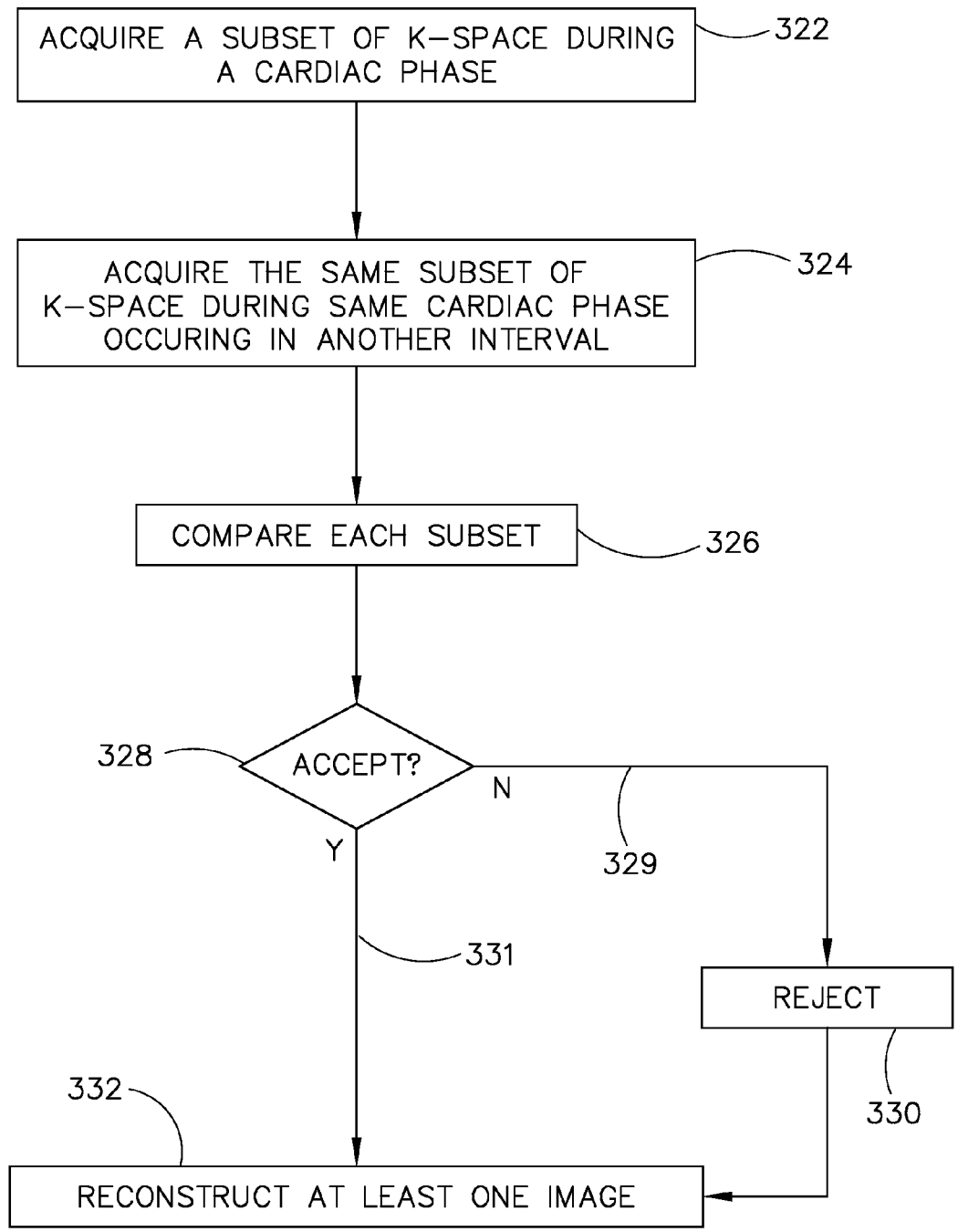
FIG. 10 is a flowchart depicting a motion detection technique according to an embodiment of the invention.
Figure 11:
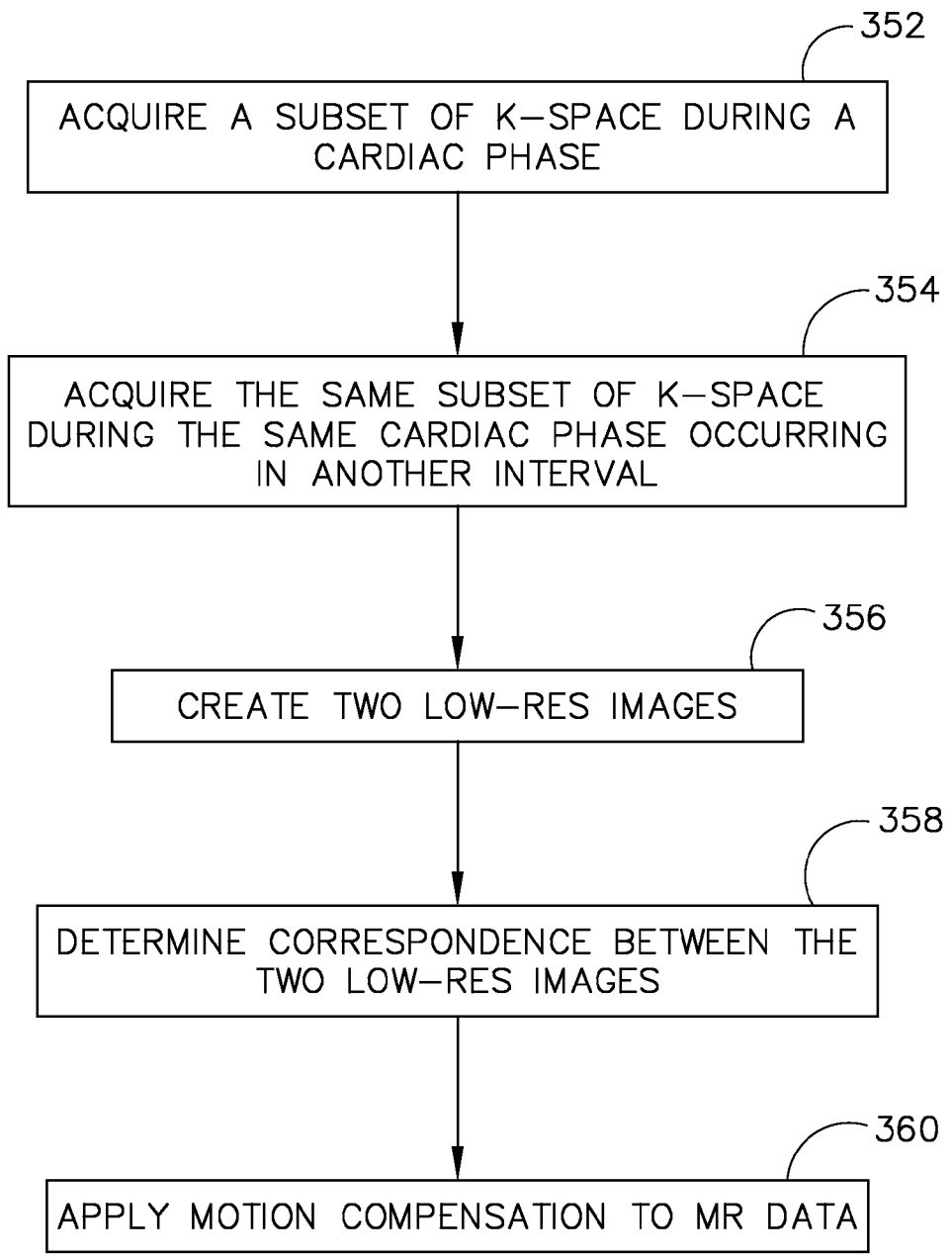
FIG. 11 is a flowchart depicting a motion compensation technique according to an embodiment of the invention.

With a conventional ECG gated k-space acquisition, often only one phase of the cardiac event is acquired. As discussed above, using the variable-center approach to acquire additional k-space data sets for additional phases allows for imaging, having high resolution and appropriate contrast, of multiple vasculatures. Further, as depicted in the flowcharts of FIG. 10 and FIG. 11, a k-space data set acquired from an additional phase can also be used to detect and/or compensate for motion. With regard to FIG. 10, a subset of a k-space is acquired during one of the two or more phases at STEP 322. The acquisition scheme employed during the other of the two or more phases is consistent with the variable center approach described above according to one embodiment. The same subset is then acquired during the same phase, but occurring during another RR cycle at STEP 324. The two acquired subsets are compared at STEP 326. Such comparison may include the comparison of phase and/or magnitude differences between the two subsets. In addition, depending on the type of comparison employed, the comparison could be made using either k-space or image-space domains. Based on such a comparison at STEP 326, a decision regarding the acceptance or rejection of the k-space subsets is made at STEP 328. The decision made at STEP 328 may be made by an operator or a computer. If it is determined 329, based on the comparison at STEP 326, that the data in one of the subsets is corrupted, then all acquisitions that were acquired during the cycle in which the later of the above-mentioned subsets was acquired are rejected at STEP 330. For example, if it is determined that phase I data acquired from a later cycle is corrupted, then the phase I and phase II data of the later cycle would be rejected. As such, the rejected data will not be used during image reconstruction at STEP 332. On the other hand, if it is determined 331 at decision STEP 328, based on the comparison at STEP 326, that the data are not corrupted, the data therefrom can be stored and later used during image reconstruction at STEP 332.

As shown in the flowchart of FIG. 11, data subsets can be used for motion compensation rather than merely motion detection. During a cardiac cycle, a subset of k-space is acquired during one of the two or more cardiac phases at STEP 352. The same subset of k-space is then acquired during the same cardiac phase, but occurring during another cardiac cycle at STEP 354. Two low-resolution images are then reconstructed from each k-space subset at STEP 356. That is, a low-resolution MR image is reconstructed from each acquired subset of k-space at STEP 356. Then, a correspondence between the two images is determined therefrom at STEP 358, thus determining motion. At STEP 360 the correspondence can then be used to apply a motion compensation technique, either prospectively or retrospectively, to compensate MR data of another subset of k-space acquired during the another cardiac cycle. As such, the correspondence can be used to reduce motion artifacts.

As will be discussed with respect to FIG. 12, not only can the present invention be used to image multiple vasculature systems during cardiac cycles with a high-resolution and with an appropriate contrast, it can be utilized with modified versions of the time-resolved CEMRA technique, such as TRICKS or TWIST, to increase temporal resolution.

Using a conventional TRICKS or TWIST acquisition scheme, the k-space domain is divided into multiple regions, or subsets, such as "$A_n$", "$B_n$", and "$C_n$". These subsets, $A_n$-$C_n$, are each acquired during a phase occurring over a series of cardiac cycles. Each region is then oversampled during MR data acquisition. The region closer to the center of k-space, referred to as A, is sampled more frequently than the outer regions of the k-space. With TRICKS, the outer regions of k-space are denoted as $B_n$ and $C_n$, with $C_n$ being the outermost region of the k-space. With TWIST, however, $B_n$ and $C_n$ represent complementary subsets of outer regions of k-space. The subscripts associated with the regions A, B, and C represent the sampling or oversampling of that region. For example, $A_1$ represents the first sampling of region A, and $A_2$ represents the second sampling of region A. The subscripts have the same significance for regions B and C. Each acquisition occurs during a different cardiac cycle. During image reconstruction, each central region, $A_n$, is paired with two outer regions that were acquired closest in time to the sampled central region. For example, $A_1$, $B_1$, and $C_1$ would be paired to form a reconstruction set for image reconstruction of one image. Further, $A_2$, $B_2$, and $C_1$ would be combined to form a second reconstruction set for reconstruction of a second image. The temporal resolution of the cardiac phase in a TRICKS or TWIST acquisition scheme is often dependent on the time between the acquisitions of two central regions (e.g., $A_1$ and $A_2$). For example, if a central region of k-space $A_n$ is oversampled every other heart beat according to a TRICKS or TWIST acquisition scheme, the temporal resolution is one image per two heartbeats. Again, it is noted that $A_1$ is the first sampling and $A_2$ represent a second sampling, or oversampling, for the central region of k-space.

Figure 12:
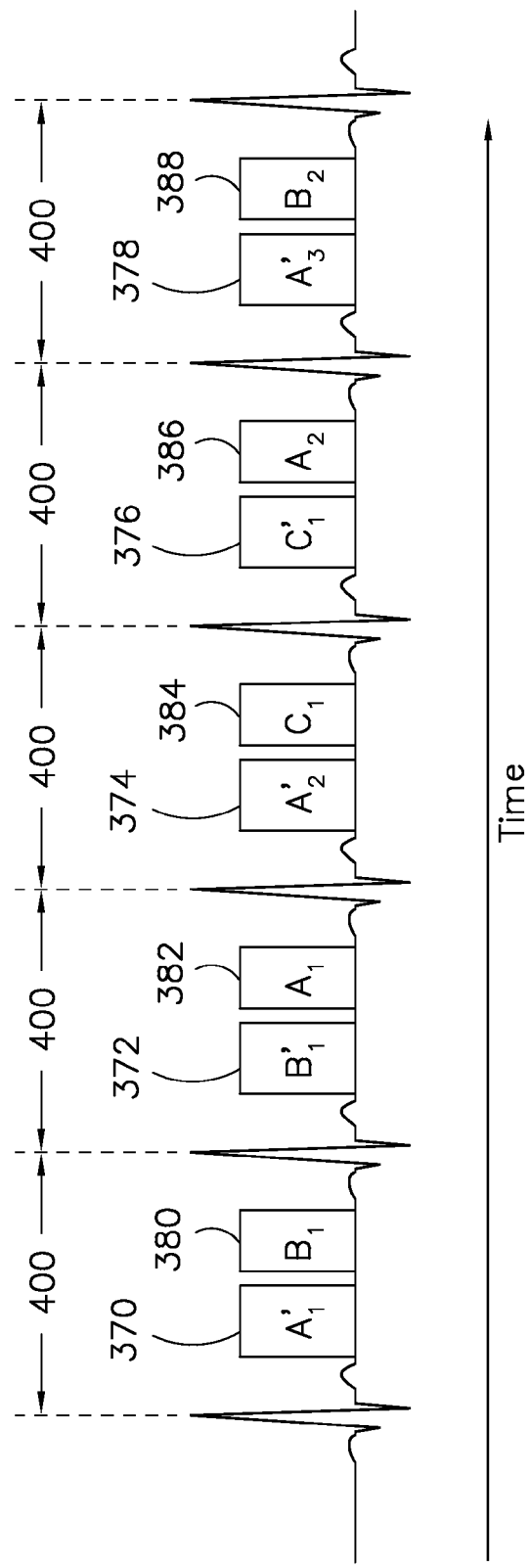
FIG. 12 is a graphical depiction of a modified time-resolved acquisition sequence using multiple k-space data sets acquired during different phases according to an embodiment of the invention.

Referring now to FIG. 12, an embodiment depicting a modified TRICKS or TWIST acquisition sequence using multiple k-space data sets acquired during different phases is depicted according to an embodiment of the invention. Acquisitions 370-378 collectively represent acquisitions during one cardiac phase. Acquisitions 380-388 represent acquisitions during a second cardiac phase. The temporal resolution is dependent on the time between the acquisitions 370, 382,

374, 386, 378 of the central regions: $A'_1, A_1, A'_2, A_2$, and $A'_3$. That is, the temporal resolution is equivalent to one image per every cardiac interval 400. During image reconstruction, each central region, A or A', is reconstructed with outer regions B or B' and C or C' that were acquired closest in time to the sampled central region. As such, compared with conventional TRICKS or TWIST acquisition schemes, the sequence shown in FIG. 12 reduces the temporal interval to one heartbeat between images, rather than only one image per two heartbeats.

Various embodiments described above employ variable-center slice ordering schemes. However, as previously mentioned, it is contemplated that other variable-center view ordering schemes may be employed in a manner consistent with the embodiments described herein. That is, variable-center frequency and/or phase ordering schemes could be employed in conjunction with, or instead of, the variable-center slice ordering schemes.

A technical contribution for the disclosed method and apparatus is that it provides for a processor implemented acquisition sequences according to view-ordering schemes.

In accordance with one embodiment, an MR imaging apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images and a computer. The computer is programmed to determine a first and second view-ordering sequence. The first view-ordering sequence comprises values corresponding to respective views of a first k-space data set, wherein the value corresponding to a central view of the first k-space data set is positioned such that acquisition of k-space data in the central view is acquired from a first anatomical region as a contrast agent passes therethrough. The second view-ordering sequence comprises values corresponding to respective views of a second k-space data set, wherein the value corresponding to a central view of the second k-space data set is positioned such that acquisition of k-space data in the central view is acquired from a second anatomical region as a contrast agent passes therethrough, and wherein the position of the value corresponding to the central view of the first k-space data set within the first view-ordering sequence is different than the position of the value corresponding to the central view of the second k-space data set within the second view-ordering sequence. The computer is further programmed to acquire MR data according to the first and second view-ordering sequences over a series of cardiac intervals to fill data in the first and second k-space data sets, respectively.

In accordance with another embodiment, a computer readable storage medium having stored thereon a computer program comprising instructions, which when executed by a computer, cause the computer to determine a first and second acquisition scheme for acquiring MR data over a series of consecutive cardiac intervals for first and second k-space data sets, respectively. The first acquisition scheme is configured to acquire MR data for a central portion of the first k-space data set from a first vasculature of the subject as a contrast agent passes through the first vasculature. The second acquisition scheme is configured to acquire MR data for a central portion of the second k-space data set from a second vasculature of the subject as the contrast agent passes through the second vasculature. The second acquisition scheme is different than the first acquisition scheme. The instructions further cause the computer to populate the first and second k-space data sets via application of the first and second acquisition schemes, respectively, and reconstruct an image from at least one of the first and second k-space data sets.

In accordance with yet another embodiment, a method of MR imaging comprises determining a first view-encode ordering scheme for filling a first k-space data set over multiple sequential cardiac intervals such that a maximum concentration of a contrast agent in a first anatomical region of a subject passes through the first anatomical region during acquisition of a central portion of the first k-space data set, and determining a second view-encode ordering scheme for filling a second k-space data set over the multiple sequential cardiac intervals such that a maximum concentration of a contrast agent in a second anatomical region of a subject passes through the second anatomical region during acquisition of a central portion of the second k-space data set. The first anatomical region is different than the second anatomical region and the first view-ordering scheme is different than the second view-ordering scheme. The method of MR imaging further comprises storing the first and second view-encode ordering schemes in computer memory.

The invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and
   a computer coupled to the MRI system and programmed to:
      determine a first view-ordering sequence comprising values corresponding to respective views of a first k-space data set, wherein a value corresponding to a central view of the first k-space data set is positioned such that acquisition of k-space data in the central view is acquired from a first anatomical region as a contrast agent passes therethrough;
      determine a second view-ordering sequence comprising values corresponding to respective views of a second k-space data set, wherein a value corresponding to a central view of the second k-space data set is positioned such that acquisition of k-space data in the central view is acquired from a second anatomical region as a contrast agent passes therethrough, and wherein a position of the value corresponding to the central view of the first k-space data set within the first view-ordering sequence is different than a position of the value corresponding to the central view of the second k-space data set within the second view-ordering sequence;
      acquire magnetic resonance (MR) data according to the first view-ordering sequence over a series of cardiac cycles to fill data in the first k-space data set; and
      acquire MR data according to the second view-ordering sequence over the series of cardiac cycles to fill data in the second k-space data set.

2. The apparatus of claim 1 wherein the computer is further programmed to:
   determine a third view-ordering sequence comprising values corresponding to respective views of a third k-space data set, wherein a value corresponding to a central view of the third k-space data set is positioned such that acquisition of k-space data in the central view is acquired from a third anatomical region as a contrast agent passes therethrough and wherein the positions of the values corresponding to the central views of the first and second k-space data sets within the first and the second view-ordering sequences, respectively, are different than a position of the value corresponding to the central view of the third k-space data set within the third view-ordering sequence; and acquire MR data according to the third view-ordering sequence over a series of cardiac cycles to fill data in the third k-space data set.

3. The apparatus of claim 1 wherein the first anatomical region and the second anatomical region overlap.

4. The apparatus of claim 1 wherein the series of cardiac cycles comprises a series of QRS complex cycles.

5. The apparatus of claim 1 wherein acquiring MR data according to the first and second view-ordering sequences comprises acquiring MR data according to the first and second view-ordering sequences via a view sharing technique in which MR data of a portion of the first k-space data set is used in the second k-space data set.

6. The apparatus of claim 1 wherein the computer is further programmed to transmit a preparation pulse before the acquisition of MR data according to the first view-ordering sequence.

7. The apparatus of claim 1 wherein the first and second k-space data sets are acquired according to one of a TRICKS and TWIST acquisition.

8. The apparatus of claim 1 wherein the first and second k-space data sets are each 3D volumetric data sets, and wherein the computer is further programmed to reconstruct a 3D image from at least one of the first and second k-space data sets.

9. The apparatus of claim 1 wherein at least one of the first k-space data set and the second k-space data set is acquired according to a parallel imaging technique.

10. The apparatus of claim 1 wherein the computer is further programmed to apply a partial Fourier Transform technique to at least one of the first k-space data set and the second k-space data set.

11. A computer readable storage medium having stored thereon a computer program comprising instructions, which when executed by a computer, cause the computer to:
determine a first acquisition scheme for acquiring magnetic resonance (MR) data for a first k-space data set over a series of consecutive cardiac cycles, the first acquisition scheme configured to acquire MR data for a central portion of the first k-space data set from a first vasculature of a subject as a contrast agent passes through the first vasculature;
determine a second acquisition scheme for acquiring MR data for a second k-space data set over the series of consecutive cardiac cycles, the second acquisition scheme is configured to acquire MR data for a central portion of the second k-space data set from a second vasculature of the subject as the contrast agent passes through the second vasculature, wherein the second acquisition scheme is different than the first acquisition scheme;
populate the first k-space data set via application of the first acquisition scheme;
populate the second k-space data set via application of the second acquisition scheme; and
reconstruct an image from at least one of the first and second k-space data sets.

12. The computer readable storage medium of claim 11 wherein the series of consecutive cardiac cycles are a series of R to R cycles of an QRS complex.

13. The computer readable storage medium of claim 11 wherein the first and second k-space data sets are populated in a single breath-hold.

14. The computer readable storage medium of claim 11 wherein the populated first k-space data set has a first number of k-space lines and the populated second k-space data set has a second number of k-space lines, and wherein the first number of k-space lines is different than the second number of k-space lines.

15. The computer readable storage medium of claim 11 wherein the instructions further cause the computer to transmit a disdaq pulse sequence to a field of view (FOV) containing the first and second vasculatures, and wherein the disdaq pulse sequence is transmitted during at least one cardiac cycle of the series of cardiac cycles.

16. The computer readable storage medium of claim 11 wherein the instructions further cause the computer to determine a correspondence between a subset of the first k-space data set acquired during one cycle of the series of cardiac cycles with the same subset of the first k-space data set acquired during another cycle of the series of cardiac cycles, and wherein the determined correspondence is used to reduce motion artifacts.

17. The computer readable storage medium of claim 11 wherein the instructions further cause the computer to compare a subset of the first k-space data set acquired during one cycle of the series of cardiac cycles with the same subset of the first k-space data set acquired during another cycle of the series of cardiac cycles to detect motion of a subject.

18. The computer readable storage medium of claim 17 wherein the instructions further cause the computer to reject, based on the comparison of the first and second k-space subsets, first and second k-space data acquired during the another cycle.

19. A method of MR imaging comprising:
determining a first view-encode ordering scheme for filling a first k-space data set over multiple sequential cardiac cycles such that a maximum concentration of a contrast agent in a first anatomical region of a subject passes through the first anatomical region during acquisition of a central portion of the first k-space data set; and
determining a second view-encode ordering scheme for filling a second k-space data set over the multiple sequential cardiac cycles such that a maximum concentration of a contrast agent in a second anatomical region of a subject passes through the second anatomical region during acquisition of a central portion of the second k-space data set,
storing the first and second view-encode ordering schemes in computer memory;
wherein the first anatomical region is different than the second anatomical region; and
wherein the first view-ordering scheme is different than the second view-ordering scheme.

20. The method of claim 19 further comprising:
acquiring a series of views of the first k-space data set according to the first view-encode ordering scheme; and
acquiring a series of views of the second k-space data set according to the second view-encode ordering scheme.

21. The method of claim 20 wherein acquiring a series of views of the first k-space data and acquiring a series of view of the second k-space data set are implemented according to a parallel imaging technique.

22. The method of claim 19 further comprising determining an interval between acquisition windows within each of the multiple sequential cardiac cycles.

* * * * *